(12) United States Patent
Graves

(10) Patent No.: US 9,835,675 B1
(45) Date of Patent: Dec. 5, 2017

(54) ELECTRICAL BRANCH CIRCUIT DETERIORATION TEST SYSTEM

(71) Applicant: Lectrispect, Inc., Golden Valley, MN (US)

(72) Inventor: Kenneth L. Graves, Golden Valley, MN (US)

(73) Assignee: Lectrispect, Inc., Golden Valley, MN (US)

(*) Notice: Subject to any disclaimer, the term of this patent is extended or adjusted under 35 U.S.C. 154(b) by 9 days.

(21) Appl. No.: 15/169,844

(22) Filed: Jun. 1, 2016

(51) Int. Cl.
| | |
|---|---|
| *G01R 31/02* | (2006.01) |
| *G01R 31/28* | (2006.01) |
| *G01R 19/04* | (2006.01) |
| *G01R 19/25* | (2006.01) |
| *G01R 19/175* | (2006.01) |

(52) U.S. Cl.
CPC ............. *G01R 31/28* (2013.01); *G01R 19/04* (2013.01); *G01R 19/175* (2013.01); *G01R 19/2503* (2013.01)

(58) Field of Classification Search
CPC .. G01R 19/04; G01R 19/175; G01R 19/2503; G01R 19/2506; G01R 19/30; G01R 19/17; G01R 31/088; G01R 31/085; G01R 31/2805; G01R 31/3275; G01R 31/3277; G01R 31/3336; G01R 31/1272; G01R 31/041; G01R 31/025; G01R 31/024; G01R 19/145
USPC .......................... 324/508, 512, 522, 528, 537
See application file for complete search history.

(56) References Cited

U.S. PATENT DOCUMENTS

| | | | |
|---|---|---|---|
| 2001/0019573 A1* | 9/2001 | Dougherty | H01H 1/0015 374/4 |
| 2012/0095706 A1* | 4/2012 | Zhou | H02H 1/0023 702/58 |
| 2014/0070833 A1* | 3/2014 | Luebke | H02S 50/10 324/754.21 |

(Continued)

OTHER PUBLICATIONS

Dedad, John, Flicker: Causes, Symptoms, and Cures, Human perception of light flicker is almost always the limiting criterion for controlling small voltage fluctuations, Electrical Construction and Maintenance, Jan. 1, 2007.

(Continued)

*Primary Examiner* — Thang Le
(74) *Attorney, Agent, or Firm* — Kinney & Lange, P.A.

(57) ABSTRACT

A system and method for detecting deteriorated junctions within an electrical circuit includes a voltage channel circuit, a load circuit, and a microcontroller. The voltage channel circuit is connectable to the electrical circuit and includes a multiplier circuit, a peak detector circuit, and a filter circuit. The multiplier circuit is configured to square a line voltage of the electrical circuit. The peak detector circuit is configured to detect peak voltages of the line voltage based on an output of the multiplier circuit. A DC output voltage is provided from the filter circuit based on the output of the multiplier circuit. The load circuit is connectable to the electrical circuit and includes a plurality of resistors and a plurality of switches controlled by the microcontroller to enable current flow through the plurality of resistors to control the line voltage. The microcontroller is configured to detect deteriorated junctions based upon comparison of an output of the peak detector circuit and the DC output voltage.

20 Claims, 7 Drawing Sheets

(56) References Cited

U.S. PATENT DOCUMENTS

2016/0187410 A1* 6/2016 Kolker ............... G01R 31/025
  361/42

OTHER PUBLICATIONS

Engel, Joseph C., Combination AFCIs: What They Will and Will Not Do, IEEE, Jan./Feb. 2012.
Elliott, Patrick C., Branch Circuits Protected by AFCI Devices and the IDEAL SureTest® Circuit Analyzers, IDEAL Test and Measurement, Aug. 2008, pp. 1-8.
Reynolds, Chad, Testing branch circuits, Electrical Construction & Maintenance, CEE News, May 1, 2002, http://ecmweb.com/print/cee-news-archive/testing-branch-circuits.
Armanda, Larry D., Voltage Drop and Test Equipment, The Weatherization Training Center, Mar. 2004, vol. 1, Issue 4, pp. 1-4.
Fluke Corporation, Test and Measurements for electrical tire prevention, http://www.fluke.com/fluke/uses/comunidad/fluke-news-plus/articlecategories/electrical/electricalfireprevention, accessed on Jun. 7, 2016.
Eliminate Excessive In-Plant Distribution System Voltage Drops, Advanced Manufacturing Office, Energy Efficiency & Renewable Energy, U.S. Department of Energy, Nov. 2012.
Allowable voltage drop on a circuit, Webpage: http://ths.gardenweb.com/discussions/2654105/allowable-voltage-drop-on-a-circuit, Nov. 14, 2006.
Load Testers Must Instruments for Every Electrician and Technician, Transcat® Newsletter, http://www.transcat.com/technical-reference/newsletters/Load_Test_Ideal.htm, Apr. 24, 2014.
Birkby, John M., Five Percent Voltage Drop—A Closer Look!, Jul. 1999.
Ashford, Tim, The Effect of Copper Oxide on Telephone and D.S.L Bearers and the Necessity for Change of Test Procedure and Selection of Suitable Testing Equipment to Locate Prevalent Copper Oxide Faults, accessed on Jun. 7, 2016.
GESJ: Physics 2010, ISSN 1512-1461, pp. 6-8, 2010.
Chen, Hao-Long, Tseng, Ke-Cheng, and Yang, Yao-Sheng, Effect of the oxide film formed on the electrical properties of Cu—Zn alloy electric contact material, Deport of Electronic Engineering, Kao Yuan University, pp. 1-12, 2012.
Cook, Brian, Electrical dangers in homes with knob and tube wiring, PowerCheck Electrical Safety Services, May 2007, news release Jun. 1, 2007.
Residential Wiring and Associated Risks, PowerCheck, 2007.
Overview of PowerCheck, Mar. 13, 2010.
Northpower safe, reliable, hassle free service, Voltage Fluctuations, http://northpower.com/network/services/voltage_fluctuations, May 9, 2014.
Northpower safe, reliable, hassle free service, House COV Inspection, http://northpower.com/network/services/house_cov, May 9, 2014.
Zhou, Xin Schoepf, Thomas J., Characteristics of Overheated Electrical Joints due to Loose Connection, IEEE, p. 149, 2011.
Benfer, Matthew, and Gottuk, Daniel, Electrical Receptacles—Overheating, Arcing, and Melting, International Association for the Fire Safety Science, Fire Safety Science-Draft Proceedings of the Eleventh International Symposium, 2014.
Mak, Alex, Corrosion of Steel, Aluminum and Copper in Electrical Applications, General Cable, accessed on Jun. 7, 2016.
Corrosion, NDT Resource Center, http://www.ndt-ed.org/EducationResources/CommunityCollege/Materials/Physical_Chemi . . . , accessed on Jun. 7, 2016.
Kessler, Crystal, Keep Galvanic Corrosion Out of Your Electrical Connections, Southland Electrical Supply, Dec. 11, 2012, http://www.southlandelectrical.com/blog/index.php/keep-galvanic-corrosion-out-of-your-e . . . .
Corrosion and Connectors, accessed on Jun. 7, 2016.
Shea, John J., Conditions for Series Arcing Phenomena in PVC Wiring, IEEE, Eaton Electrical, Sep. 2007.
Shea, John J., Glowing Contact Physics, IEEE, Eaton Electrical, Sep. 2006.
Shea, John J., Identifying Causes for Certain Types of Electrically Initiated Fires in Residential Circuits, IEEE, Eaton Electrical, 2006.
Korinek, Chris W., Korinek, Timothy C., Lopez, Hugo F., Pre and Post-Flashover Characteristics of an Electrically Overheated Poor Connection Between Copper and Steel, Jan. 30, 2013.
Lee, Douglas A., Trotta, Andrew M., King, William H., Jr., New Technology for Preventing Residential Electrical Fires: Arc-Fault Circuit Interrupters (AFCIs), pp. 1-31, Aug. 2000.

* cited by examiner

ELECTRICAL BRANCH CIRCUIT DETERIORATION TEST SYSTEM

BACKGROUND

The present invention relates generally to electrical systems, and in particular to a system and method for testing building electrical systems.

Residential and commercial buildings, for example, often include complex electrical wiring systems that include several branch circuits. These wiring systems may, over time, develop loose connections and/or deteriorated junctions. At these deteriorated junctions, heat may be produced which may form an oxide when a copper wire heats and cools. Copper oxide has semiconductor characteristics and may behave as a p-n junction possessing a forward conducting voltage and a reverse breakdown voltage. When line currents pass through the deteriorated junction, the built up oxide causes further heating and cooling, which in turn, generates further oxide buildup. It is desirable to detect these deteriorated junctions early and effectively so as to facilitate repair of the junction prior to it evolving into a more serious electrical issue.

SUMMARY

A system for detecting deteriorated junctions within an electrical circuit includes a voltage channel circuit, a load circuit, and a microcontroller. The voltage channel circuit is connectable to the electrical circuit and includes a multiplier circuit, a peak detector circuit, and a filter circuit. The multiplier circuit is configured to square a channel voltage indicative of the line voltage of the electrical circuit. The peak detector circuit is configured to detect a peak voltage of the channel voltage based on an output of the multiplier circuit. The filter circuit is configured to provide a direct current (DC) output voltage based on the output of the multiplier circuit. The load circuit is connectable to the voltage channel and includes a plurality of resistors and a plurality of switches. The microcontroller is configured to control the plurality of switches to enable current to flow through the plurality of resistors to measure the channel voltage of the electrical circuit, and wherein the microcontroller is configured to detect a deteriorated junction based upon a comparative shift of the output of the peak detector circuit and/or the DC output voltage.

A method of testing for deteriorated junctions within an electrical circuit includes connecting, by a microcontroller, a first set of resistors across a line voltage of the electrical circuit to draw a first current; outputting, by a peak detector circuit, a peak voltage of the line voltage based on the draw of the first current; connecting, by the microcontroller, a second set of resistors across the line voltage to draw a second current greater than the first current; outputting, by a first filter circuit, a direct current (DC) output voltage based on the line voltage and the draw of the second current; and detecting, by the microcontroller, a deteriorated junction of the electrical circuit based on the peak voltage and the DC output voltage.

DETAILED DESCRIPTION

A system and method is disclosed herein for detecting deteriorated junctions in electrical circuits. The system includes a plug-in device that attaches to electrical branch circuits, for example, through outlets and/or other receptacles. The plug-in device includes circuits configured to perform, for example, two test protocols. The first test protocol includes detection of a peak voltage. The peak voltage is detected, for example, by squaring the sinusoidal channel voltage on the branch circuit under test. The detected peak voltage may be provided to a microcontroller for further processing. If the peak voltage indicates a significant voltage alteration from the circuit breaker panel to the test device, a deteriorated junction may be indicated.

The second test protocol includes monitoring direct current (DC) and low frequency components of the channel voltage on the branch circuit under test over an extended time period of three minutes, for example, while also monitoring the current in the branch circuit for random disturbances. This second test protocol allows the branch circuit to heat up, causing a deteriorated junction to act as a modulating entity. This modulation may be detected by monitoring the DC and low frequency components of the channel voltage on the branch circuit under test. The deteriorated junction may also produce random disturbances in the current on the branch circuit under test. During the second test protocol, the current channel compares or correlates a voltage indicative of the line current to a reference voltage indicative of the undisturbed line current to detect random disturbances in line current. In this way, deteriorated junctions may be detected by both a peak voltage and low frequency components of a heated circuit using the voltage channel and by random disturbances in line current using the current channel.

Figure 1:
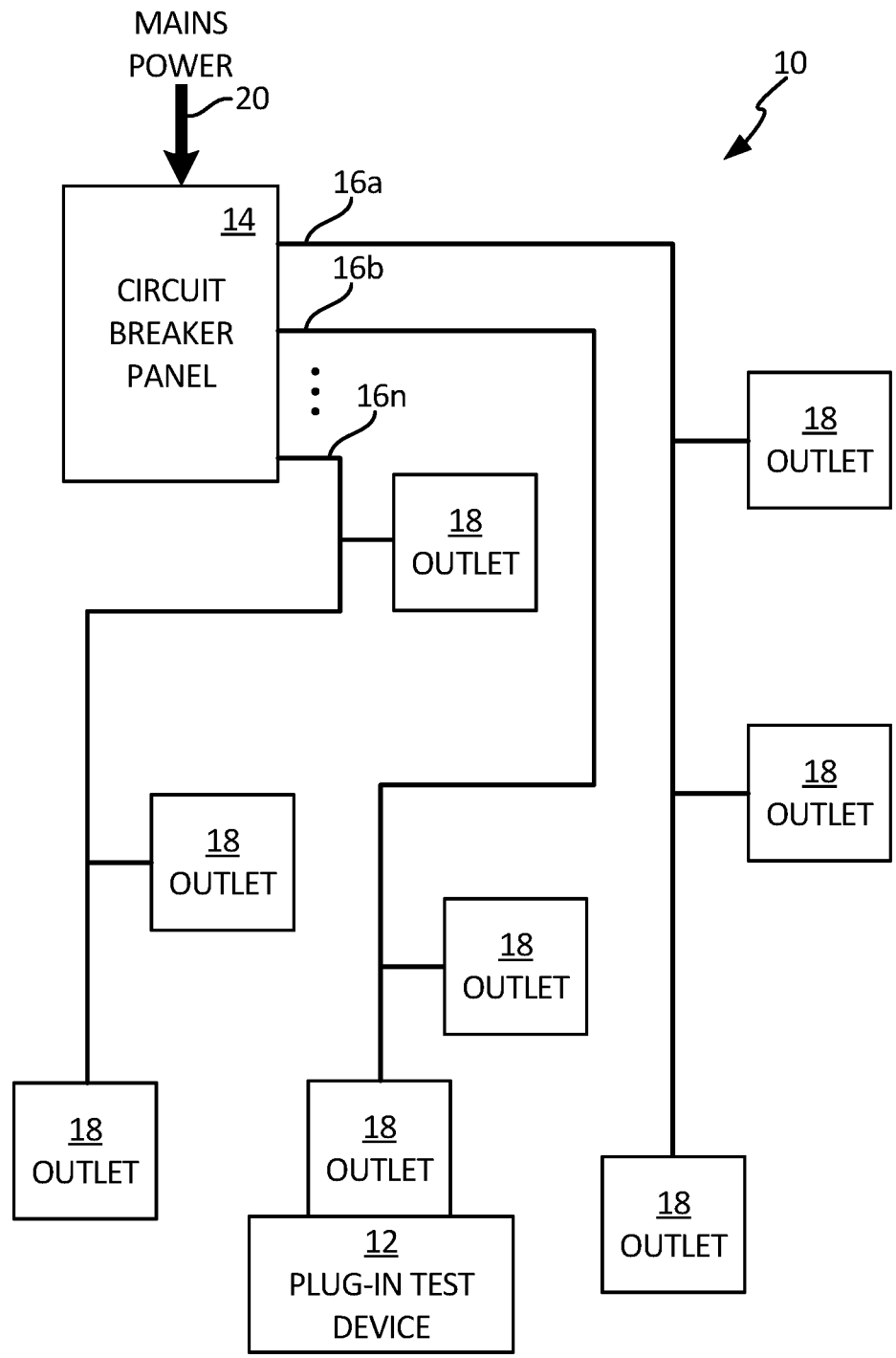
FIG. 1 is a block diagram illustrating an electrical system that includes a plug-in test device for detecting deteriorated junctions.

FIG. 1 is a block diagram illustrating electrical circuit 10 that includes plug-in test device 12 for detecting deteriorated junctions. Circuit 10 includes circuit breaker panel 14 and branch circuits 16a-16n. Each branch circuit 16a-16n includes any number of outlets 18. Plug-in test device 12 may connect to, for example, any of outlets 18. In other embodiments, plug-in test device 12 may be configured to attach to other end-points of a branch circuit 16a-16n such as, for example, plugged into receptacles or attached to switches. Circuit breaker panel 14 may be utilized to control, through individual circuit breakers, the distribution of mains power 20 to each respective branch circuit 16a-16n.

Figure 2:
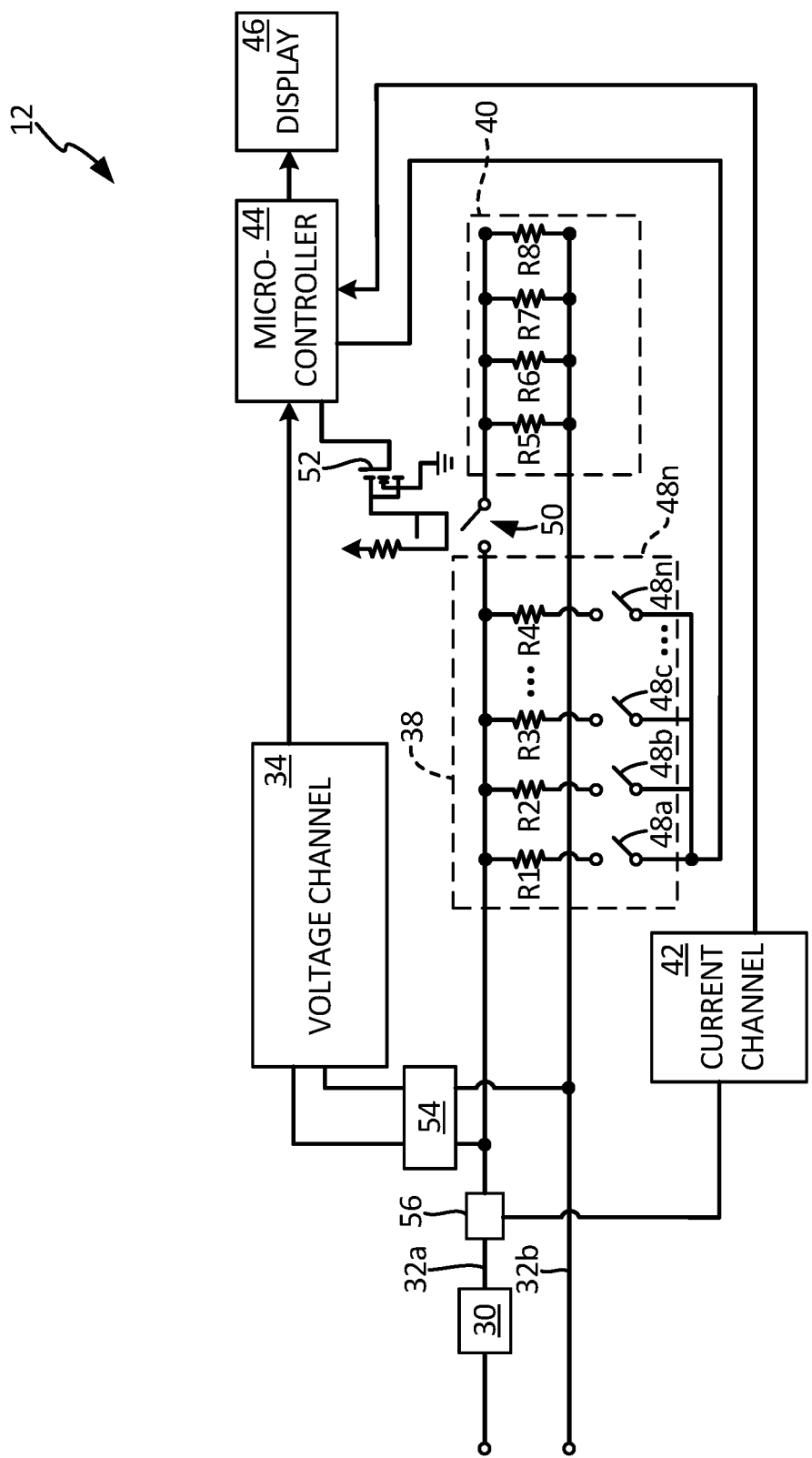
FIG. 2 is a block diagram illustrating a plug-in test device for detecting deteriorated junctions in a branch circuit of an electrical system.

With continued reference to FIG. 1, FIG. 2 is a block diagram illustrating plug-in test device 12 for detecting deteriorated junction 30 in any of branch circuits 16a-16n. Test device 12 may be connected to outlet 18 and is configured to monitor lines 32a and 32b of the respective branch circuit 16a-16n to detect, for example, deteriorated junction 30. Deteriorated junction 30 may be, for example, any junction in the respective branch circuit 16a-16n that has become loose, corroded, oxidized, or deteriorated in any other way.

Test device 12 includes voltage channel 34, first resistor circuit 38, second resistor circuit 40, current channel 42, microcontroller 44, display 46, switches 48a-48n, relay 50, relay control switch 52, attenuator 54 and current sensor 56. Microcontroller 44 may be any circuit capable of, for example, executing software or other programmed instructions. First resistor circuit 38 may be a load circuit that includes resistors R1-R4, and second resistor circuit 40 may be a load circuit that includes resistors R5-R8. Microcontroller 44 receives input from voltage channel 34 and current channel 42, and provides output to control display 46, switches 48a-48n, and relay 50. Display 46 may be any display capable of providing visual and/or audio output, such as a light-emitting diode (LED) display. Display 46 may be utilized, for example, to provide visual indications regarding a tested branch circuit 16a-16n such as, but not limited to, detected arc faults, detected deteriorated junctions, successful tests, internal faults and any other desirable information.

In an embodiment, voltage channel 34 and current channel 42 may be implemented on the same circuit board, for example. This circuit board may be located in a first housing, along with first resistor circuit 38 (which may be implemented on a separate circuit board, for example). Second resistor circuit 40 may be implemented within a second housing, apart from the first housing. This may be advantageous due to the power drawn, and thus, the heat generated by second resistor circuit 40. The two housings may be connected by wiring, for example.

Plug-in test device 12 may perform, for example, two tests for a respective branch circuit 16a-16n. The first test may be referred to as a "cold junction test." During the cold junction test, switches 48a-48n are controlled by microcontroller 44 to enable current flow through respective resistors R1-R4. Resistors R1-R4 are sized, for example, to not draw an excessive amount of current so as not to heat the respective branch circuit 16a-16n. However, resistors R1-R4 may be sized such that the current draw is great enough to establish a baseline peak voltage for the cold junction test.

Upon beginning the cold junction test, all cord and plug appliances may be disconnected from wall receptacles and outlets 18 of the respective branch circuit 16a-16n. This ensures that the respective branch circuit 16a-16n is sufficiently isolated from any equipment that may influence the test of the respective branch circuit 16a-16n. This test may be performed, for example, for each outlet 18 of the respective branch circuit 16a-16n. Test device 12 may be configured to connect directly to outlets 18. In other embodiments, test device 12 may be configured to plug into other receptacles or other portions of a respective branch circuit 16a-16n.

Switches 48a-48n may be controlled, for example, in succession to enable a greater current draw over several line cycles. For example, switch 48a may be enabled for a short time period, such as several cycles of current on line 32a, to enable a first current draw through resistor R1. This may be repeated for each switch 48a-48n to gradually increase the current over several cycles. By drawing current through resistors R1-R4 for a short time, microcontroller 44 is able to determine peak voltages using voltage channel 34 for the respective branch circuit 16a-16n while the circuit is at a relatively cool temperature. Switches 48a-48n may be implemented as thyristors, for example, or as any other type of switch controllable to provide current to resistors R1-R4.

Microcontroller 44 may utilize the determined peak voltage to detect a deteriorated junction within the respective branch circuit 16a-16n. For example, the maximum amplitude of the voltage coming into circuit breaker panel 14 from mains power 20 may be 170 volts. If the peak voltage detected by voltage channel 34 during the cold junction test is 150 volts, for example, microcontroller 44 may indicate a deteriorated junction for the respective branch circuit 16a-16n. Microcontroller 44 may be configured to indicate a deteriorated junction for any selected voltage drop such as, for example, a five percent voltage drop. Microcontroller 44 may utilize a calibrated voltage from current channel 42 and the determined peak voltage to determine the impedance of the branch circuit 16a-16n. Microcontroller 44 may be configured to indicate a deteriorated junction for any selected impedance shift such as, for example, a five percent shift or from an absolute impedance value, for example, of 0.5 Ohms.

The second test may be referred to as the "extended time test." In the extended time test, second resistor circuit 40 may be utilized to draw significant current from line 32a for an extended period of time such as, for example, several minutes. Resistors R5-R8 may be power resistors implemented, for example, as glass fired resistors mounted on fan cooled heat sinks. In other embodiments, any other linear load capable of handling large currents may be utilized in place of resistors R5-R8. Switch 52 may be controlled by microcontroller 44 to control relay 50. Relay 50 is closed during the extended time test to enable current flow to resistors R5-R8. Switch 52 may be implemented as a metal-oxide-semiconductor field-effect transistor (MOSFET) or any other switch controllable by microprocessor 44.

Heat is a product of deteriorated junction 30. When a copper wire, for example, heats and cools, oxides may be formed on the wire. As the thickness of the oxide increases, more heat may be produced at the junction, which in turn results in even greater oxide formation. Copper oxides, for example, have semiconductor properties and act as a resistive p-n junction. A p-n junction is a non-linear, rectifying device possessing a forward conducting voltage and a reverse breakdown voltage. When a line current of 60 Hz, for example, passes through deteriorated junction 30, heating and cooling effects may occur (i.e., the circuit heats as the line voltage reaches its maximum amplitude, and cools as the line voltage passes through zero volts) and deteriorated junction 30 may amplitude modulate the line voltage as well as produce additional frequency components on lines 32a and 32b. The extended time test is utilized to detect the amplitude modulation and additional frequency components.

Another product of a deteriorated junction may be random pulse-like disturbances in the current on lines 32a and 32b. These disturbances may be indicative of charge build-up and air breakdown of the junction, for example. These random disturbances in line current can generate further heat, which may exacerbate the deterioration of junction 30. The extended time test is further utilized to detect these random disturbances in current on lines 32a and 32b using current channel 42.

Prior art methods of detecting deteriorated junction 30 include monitoring the line voltage on lines 32a and 32b solely to observe a voltage drop. For example, a device may be connected to one of outlets 18 for a short time period to detect a voltage drop from breaker panel 14 to outlet 18. If the voltage drop is greater than a given amount, a deteriorated junction may be indicated. This method does not allow the circuit to generate any significant heat, which might prevent deteriorated junction 30 from modulating or producing any other additional frequency components. Because of this, deteriorated junctions 30 may go undetected. By heating each branch circuit 16a-16n and monitoring for modulation and other frequency components, such as random disturbances in current, deteriorated junctions 30 may be detected and repaired in a sooner, more efficient manner.

Current channel 42 may be utilized to detect random disturbances in current on the respective branch circuit 16a-16n. Current channel 42 may generate a reference voltage indicative of the undisturbed line current that may be compared to a voltage indicative of the current on lines 32a and 32b. Load current may be sensed by current sensor 56 and provided to current channel 42. Current channel 42 may condition the sensed current to generate a reference voltage indicative of the expected current on lines 32a and 32b in the absence of any random disturbances. Current channel 42 may compare the generated reference voltage to a voltage indicative of the actual sensed current on lines 32a and 32b to detect random disturbances in the current. Deteriorated junction 30 may cause the current on lines 32a and 32b to display random, pulse-like disturbances indicative of charge build-up and air breakdown at junction 30. These disturbances may generate significant heat, which may cause further breakdown of deteriorated junction 30. By detecting any random disturbances in current, current channel 42 allows plug-in device 12 to effectively detect deteriorated junction 30.

With continued reference to FIGS. 1 and 2, FIGS. 3A and 3B are a block diagram and circuit schematic, respectively, of voltage channel 34. Voltage channel 34 includes differential amplifier 60, multiplier circuit 62, amplifier 64, low pass filter 66, peak detector circuit 68, direct current (DC) processing circuit 70 and zero-cross detection circuit 72 (which receives a reference voltage input illustrated as reference circuit 71 in FIG. 3B). Differential amplifier 60 may be implemented to receive and condition the signals on lines 32a and 32b through attenuator 54. Attenuator 54 may be implemented as a transformer, for example, to adjust the voltage from lines 32a and 32b to a desirable voltage for voltage channel 34.

A simple model of the line voltage in the presence of a heat-induced modulating deteriorated junction is illustrated by equation [1]:

$$V_L = (V_P)\left(1 + \frac{-r(t)}{R + r(t)}\right)\cos(wt) \quad [1]$$

where:
$V_L$ is the line voltage;
t is time;
$V_p$ is the peak line voltage (e.g., one hundred seventy volts);

$$\frac{-r(t)}{R + r(t)}$$

is the modulating mechanism (i.e. deteriorated junction 30); and $$W = 2\pi f \frac{\text{rad}}{\text{sec}}.$$

For amplitude modulation, direct current (DC) and low frequency components are not considered to provide useful information and are traditionally discarded. However, in the case of a deteriorated junction, the modulation frequency may be of the same order as the carrier signal and thus, the information regarding deteriorated junction 30 may be contained only within the DC and low frequency components of the line voltage.

To process this information, multiplier circuit 62 is utilized to "square" the signal received through differential amplifier 60. When squaring the signal, the result may be modeled as a square of equation [1], as illustrated by equation [2]:

$$\left(\frac{V_P}{n}\right)^2\left(1 + \frac{-r(t)}{R + r(t)}\right)^2 \cos^2(wt) = \frac{\left(\frac{V_P}{n}\right)^2\left(1 + \frac{-r(t)}{R + r(t)}\right)^2}{2}(1 + \cos 2wt) \quad [2]$$

where n is the attenuation produced by attenuator 54, for example.

The $2^{nd}$ harmonic may be filtered from equation [2] (e.g., using low pass filter 66) and the result, illustrated in equation [3], provides DC and low frequency information about deteriorated junction 30.

$$V_{DC\ and\ Low\ Freq} = \frac{\left(\frac{V_P}{n}\right)^2\left(1 + \frac{-r(t)}{R + r(t)}\right)^2}{2} \quad [3]$$

Where $V_{DC\ and\ Low\ Freq}$ is the output, for example, of low pass filter 66.

The output of low pass filter circuit 66, as modeled by equation [3], may be processed by DC processing circuit 70 and provided to microcontroller 44. This processing may include, for example, conditioning of the signal, further filtering of unwanted components, and any other desired conditioning of the DC and low-frequency analog components provided to microcontroller 44.

As described above, deteriorated junction 30 acts as a modulating entity when the respective branch circuit 16a-16n is heated. DC and low frequency components are produced, and are a result of line voltage amplitude modulation as the respective branch circuit 16a-16n heats and cools. Thus, low pass filter circuit 66 and DC processing circuit 70 may be utilized during the extended time test to detect deteriorated junctions 30 while the circuit is heating up through the use of second resistor circuit 40. Microprocessor 44 detects the modulations within the DC and low frequency components provided by voltage channel 34 to detect deteriorated junction 30.

For the cold junction test, voltage channel 34 further includes peak detection of the channel voltage, which is also processed from the output of multiplier circuit 62, as modeled in equation [2]. Amplifier circuit 64 receives the output of multiplier circuit 62 and provides signal conditioning. This may include, for example, amplification of the signal to provide ease of processing for peak detector circuit 68. Peak detector circuit 68 may provide an output to microcontroller 44 indicative of a peak voltage seen on lines 32a and 32b for a given time period.

Figure 3A:
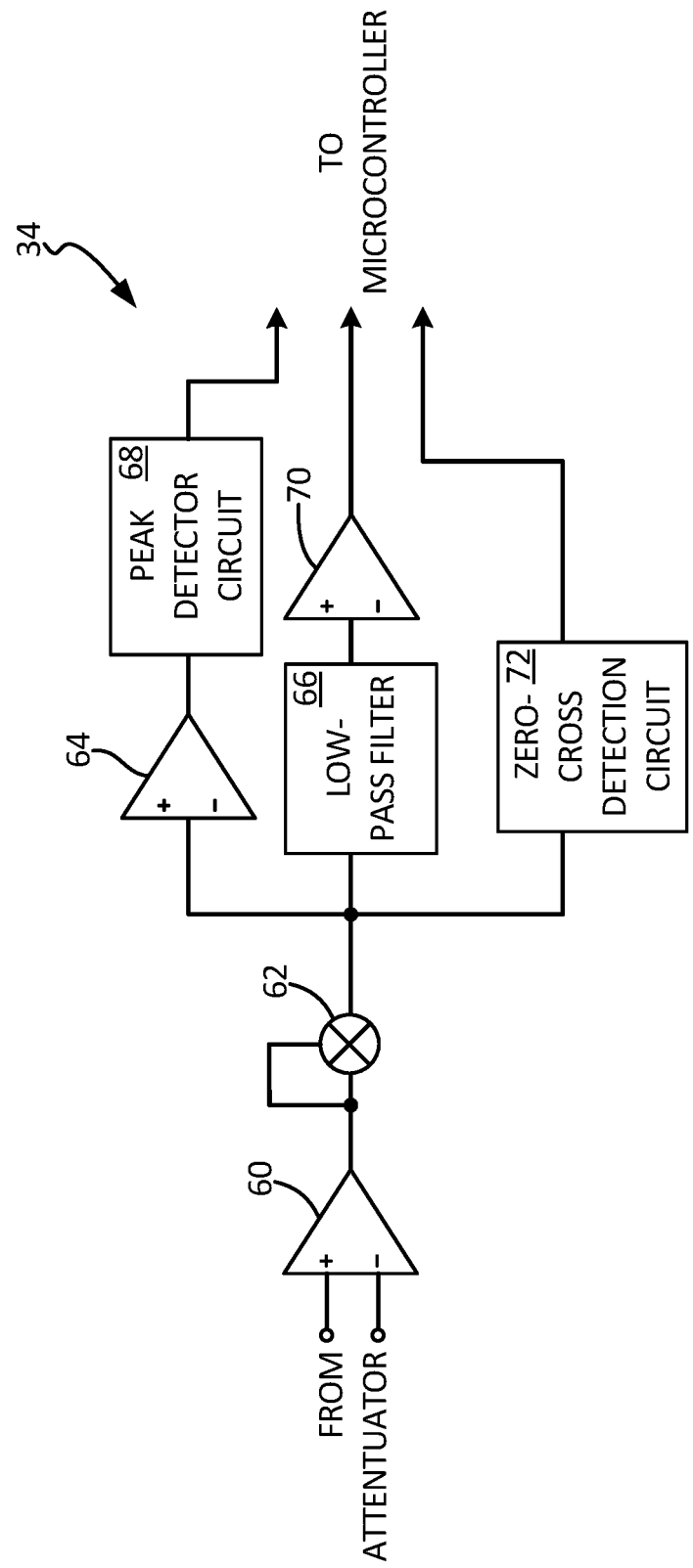
FIGS. 3A and 3B are a block diagram and circuit schematic, respectively, of a voltage channel utilized to detect deteriorated junctions in a branch circuit of an electrical system.
Figure 3B:
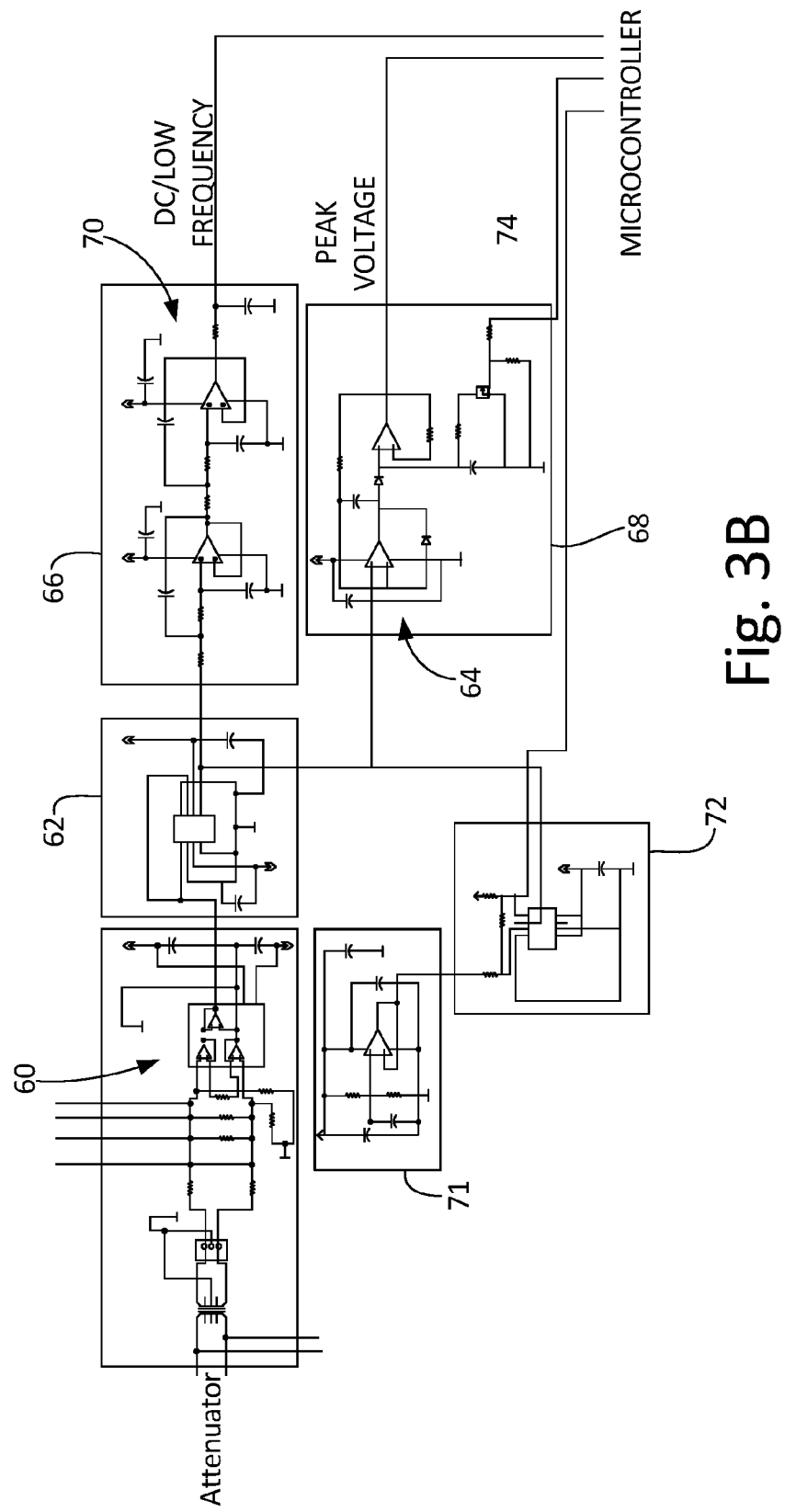
Figure 4A:
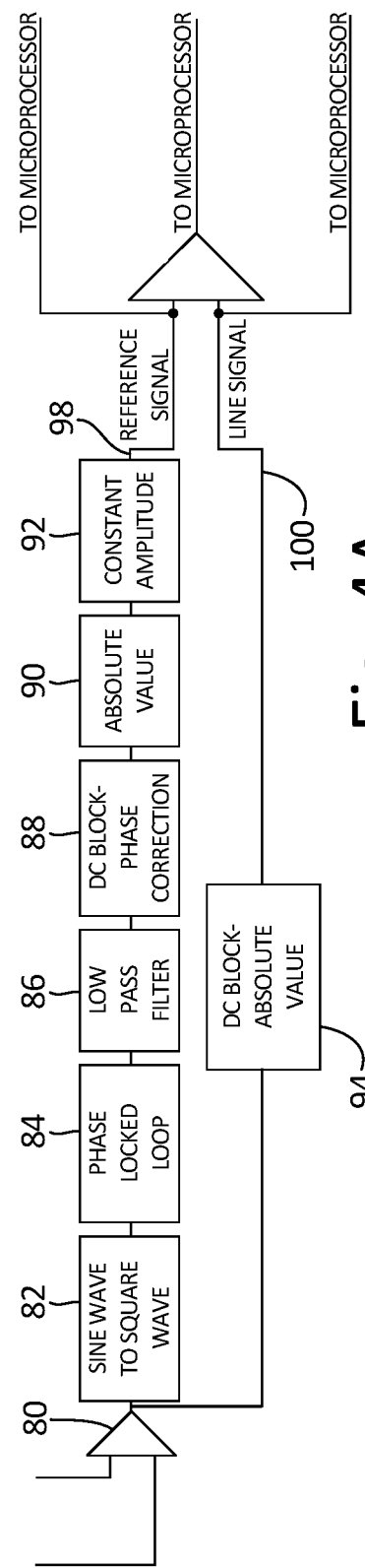
FIGS. 4A and 4B are a block diagram and circuit schematic, respectively, of a current channel utilized to detect deteriorated junctions in a branch circuit of an electrical system.
Figure 4B:
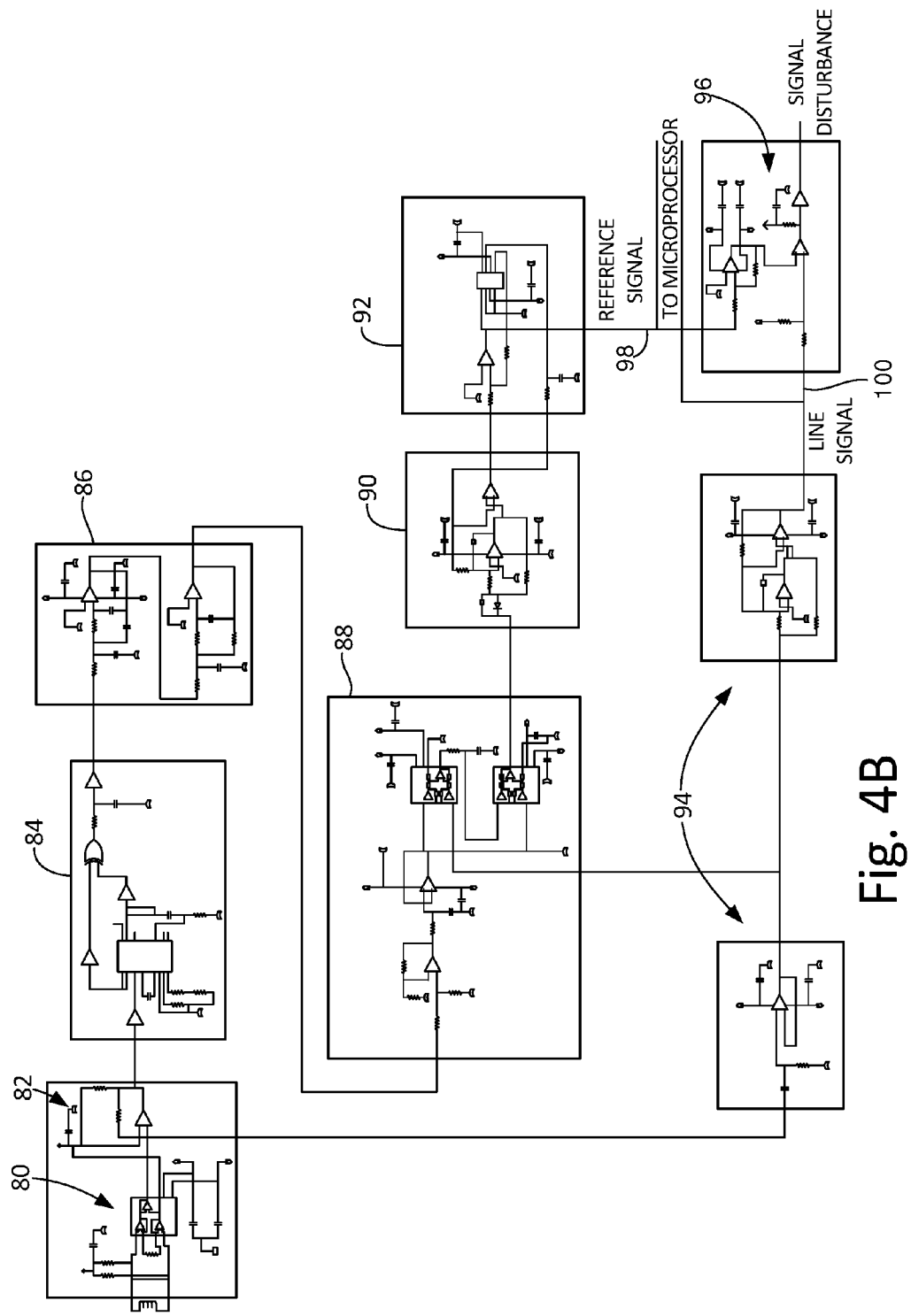
Figure 5:
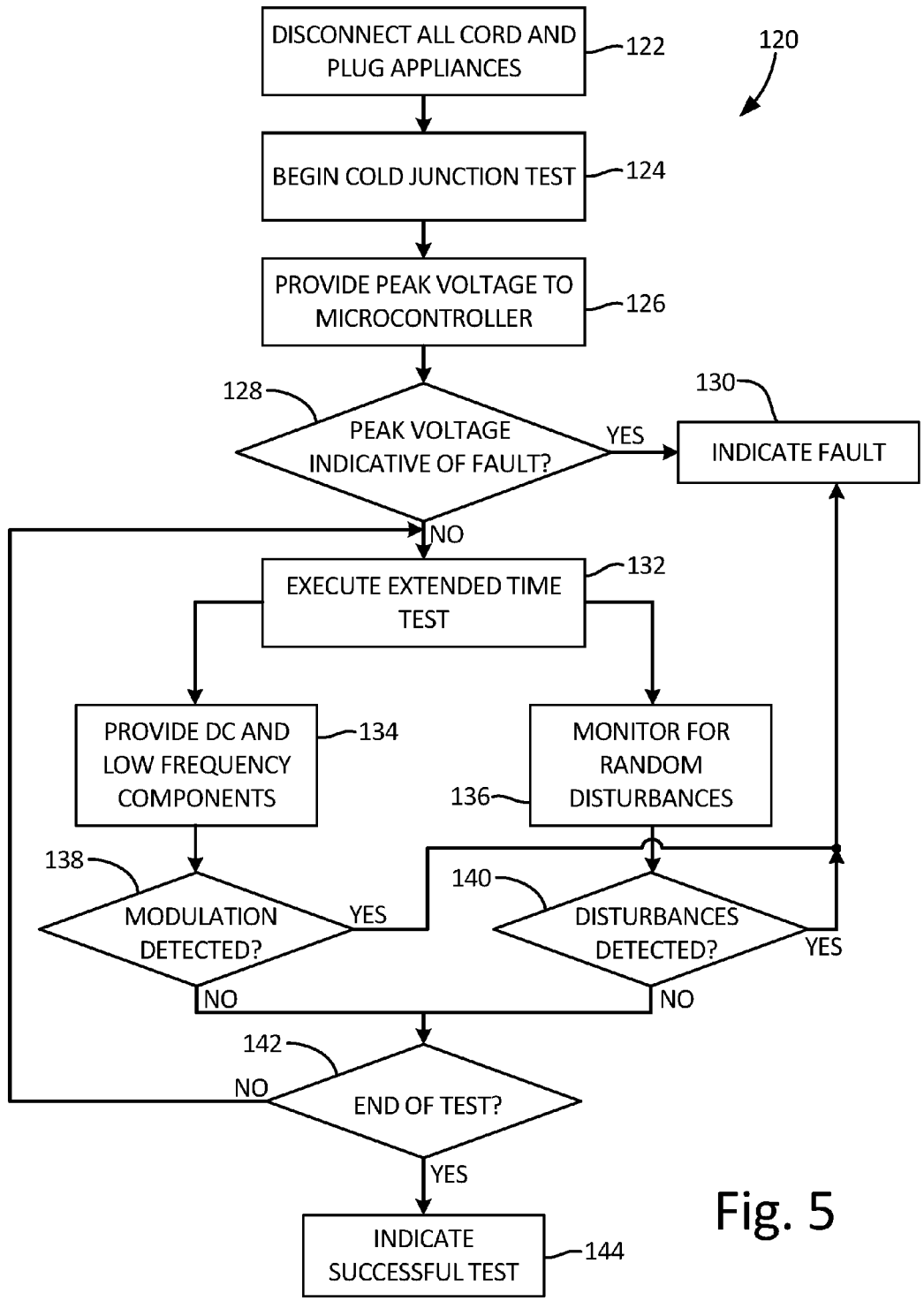
FIG. 5 is a flowchart illustrating a method of detecting deteriorated junctions in electrical circuits utilizing a plug-in test device.

As illustrated in FIG. 3B, peak detection circuit 68 may include reset line 74 from microcontroller 44. This reset line may allow microcontroller 44 to "reset" the peak voltage output of peak detector circuit 68 to a baseline value, such as zero volts, in order to start tracking a new peak voltage based on switch configuration 48a-48n as controlled by microcontroller 44. This way, the output of peak detector circuit 68 will be a voltage value indicative of the peak voltage on lines 32a and 32b during the duration of each respective switch configuration 48a-48n.

Zero-cross detection circuit 72 may be utilized to provide an indication to microcontroller 44 that the line voltage on lines 32a and 32b is at a zero-crossing (i.e. the voltage is passing from positive to negative or negative to positive). This may be useful for microcontroller 44 when controlling, for example, switches 48a-48n and 52 of test device 12. By switching at zero-crossing of the line voltage, the electromagnetic interference (EMI) that may be generated during that switching is reduced, providing better performance for test device 12.

With continued reference to FIGS. 1-3B, FIGS. 4A and 4B are a block diagram and circuit schematic, respectively, of current channel 42. Current channel 42 includes input amplifier circuit 80, square wave circuit 82, phase locked loop (PLL) circuit 84, low pass filter 86, DC block and phase correction circuit 88, absolute value circuit 90, constant amplitude circuit 92, DC block and absolute value circuit 94, and signal comparison circuit 96. The output of constant amplitude circuit 92 is a positive voltage reference signal that is indicative of the undisturbed line current and provided to signal comparison circuit 96 and microcontroller 44. The output of DC block and absolute value circuit 94 is a positive voltage value indicative of the current on lines 32a and 32b and is provided to signal comparison circuit 96 and microcontroller 44.

The reference signal is a value that may be indicative of an expected current on lines 32a and 32b in the absence of any deteriorated junctions within the respective branch circuit 16a-16n. Input amplifier circuit 80 provides a single-ended output based on the differential input from current sensor 56. Square wave circuit 82 converts the input signal (i.e., the sine wave signal) into a non-sinusoidal periodic signal. This signal is provided to PLL circuit 84. PLL circuit 84 may be utilized to lock onto the line frequency of the square wave signal from circuit 82 to control the phase and/or frequency of the reference signal. The output of PLL circuit 84 is provided to low pass filter 86, which may be implemented to pass the line frequency while rejecting higher order harmonics of the PLL output. DC block and phase correction circuit 88 may be configured to filter DC components of the reference signal and correct the phase of the reference signal from low pass filter circuit 86 to match the phase of the line current. The phase may need to be corrected due to phase shifts caused by low pass filter 86 and/or other analog delay components of current channel 42. Absolute value circuit 90 may be configured to provide a unidirectional signal indicative of the magnitude of the input signal. Absolute value circuit 90 may also provide zero cross-over distortion, for example, which may flatten the reference signal at zero crossings. The output of absolute value circuit 90 may be provided to constant amplitude circuit 92 which may be configured to provide automatic gain control, for example, to control the amplitude of the reference signal. For example, amplitude circuit 92 may include a divider feedback circuit utilized to maintain a desired amplitude of the reference single when the line signal, for example, decreases unexpectedly based on random disturbances in the line current. The reference signal 98 output by constant amplitude circuit 92 may be conditioned and provided to signal comparison circuit 96 as a first input.

DC block and absolute value circuit 94 may be configured to filter any DC components from amplifier circuit 80 and provide a unidirectional signal (of the same direction as the reference signal) indicative of the magnitude of the line current on lines 32a and 32b. The output of DC block and absolute value circuit 94 may be provided to signal comparison circuit 96 as a second input.

Signal comparison circuit 96 may be configured to compare reference signal 98 to the conditioned line signal 100. During normal operation of the respective branch circuit 16a-16n, the conditioned line signal will be greater than the reference signal. In the event of random disturbances in the line current of the respective branch circuit 16a-16n, the line signal will decrease toward zero, while the reference signal does not. Therefore, signal comparison circuit 96 may be configured to provide indication to microprocessor 44 whenever the line signal falls below the reference signal. Microprocessor 44 may utilize this indication to detect deteriorated junction 30 and/or other disturbances on respective branch circuit 16a-16n. The line signal and reference signal may also be provided directly to microprocessor 44 in order to allow microprocessor to perform further monitoring and correlation.

With continued reference to FIGS. 1-4B, FIG. 5 is a flowchart illustrating method 120 for testing branch circuits 16a-16n for deteriorated junction 30 utilizing test device 12. All steps may be performed by any combination of software or other programmed instructions implemented on microcontroller 44, other circuit components, and a technician performing a test utilizing test device 12.

At step 122, all cord and plug appliances may be disconnected from wall receptacles and outlets 18 of the respective branch circuit 16a-16n. This ensures that the respective branch circuit 16a-16n under test is sufficiently isolated from any equipment that may influence the test of the respective branch circuit 16a-16n.

At step 124, the cold junction test is started by enabling thyristors 48a-48n in succession, for example, to enable current to flow to first resistor circuit 38. Microcontroller 44 resets peak voltage detector circuit 68. At step 126, peak detector circuit 68 is utilized to provide a voltage to microcontroller 44 that is indicative of the peak voltage on lines 32a and 32b. At step 128, microcontroller 44 determines if a deteriorated junction 30 is present based upon the peak voltage provided by peak detector circuit 68. For example, if the peak voltage from the utility company on mains power input 20 is 170 volts, microcontroller 44 may check to verify that the peak voltage provided by peak detector circuit 68 is no less than five percent lower, for example, than one hundred and seventy volts. If it is, method 120 may proceed to step 130 and indicate that a deteriorated junction has been detected in the respective branch circuit 16a-16n under test. If no deteriorated junction is detected at step 128, method 120 proceeds to step 132.

At step 132, the "cold junction test" is over and the "extended time test" begins. Microcontroller 44 disables current flow to first resistor circuit 38 by controlling thyristors 48a-48n. Microcontroller 44 enables switch 52 to close relay 50 to enable current flow to second resistor circuit 40. Second resistor circuit 40 draws significantly more power than first resistor circuit 38 and thus, heats up the respective branch circuit 16a-16n.

At step 134, voltage channel 34 provides DC and low frequency components of the line voltage to microcontroller 44. Microcontroller 44 monitors the DC and low frequency components to determine if a deteriorated junction is detected in the respective branch circuit 16a-16n. Simultaneously to step 134, at step 136, microcontroller 44 monitors the output of current channel 42 to monitor, for example, any random disturbances in the line current apart from the utility frequency generated on lines 32a and 32b.

At step 138, it is determined if the DC and low frequency components provided by voltage channel 34 are indicative of a deteriorated junction. If so, method 120 proceeds to step 130 and a warning is indicated. The deteriorated junction warning may be indicated to a technician, for example, using display 46. At step 140, it is determined, by microcontroller 44, if the output of current channel 42 is indicative of random disturbances in the line current. If so, method 120 proceeds to step 130 and a warning is indicated. If no modulation is detected at step 138 and no random disturbances are detected at step 140, method 120 proceeds to step 142.

At step 142, it is determined if the extended time test has completed. If it is not completed (e.g., the test has not been run for the full time, for example, of three minutes), method 120 returns to step 132 and continues to run the extended time test. If the test is completed, method 120 proceeds to step 144 and a successful test is indicated. Method 120 may be repeated for all outlets 18 of each respective branch circuit 16a-16n.

While the invention has been described with reference to an exemplary embodiment(s), it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment(s) disclosed, but that the invention will include all embodiments falling within the scope of the appended claims.

The invention claimed is:

1. A system for detecting deteriorated junctions within an electrical circuit, the system comprising:
    a voltage channel circuit connectable to the electrical circuit, the voltage channel circuit comprising:
    a multiplier circuit configured to square a channel voltage indicative of a line voltage of the electrical circuit;
    a peak detector circuit configured to detect a peak voltage of the channel voltage based on an output of the multiplier circuit; and a first filter circuit configured to provide a direct current (DC) output voltage based on the output of the multiplier circuit;
    a load circuit connectable to the electrical circuit, the load circuit comprising a plurality of resistors and a plurality of switches; and
    a microcontroller configured to control the plurality of switches to enable current to flow through the plurality of resistors to measure the channel voltage, and wherein the microcontroller is configured to detect a deteriorated junction based upon a comparative shift of an output of the peak detector circuit and the DC output voltage.

2. The system of claim 1, further comprising a current channel circuit configured to detect random disturbances in line current of the electrical circuit.

3. The system of claim 2, wherein the current channel circuit comprises:
    a reference circuit configured to generate a reference signal based on the line current; and
    a comparator circuit configured to compare the reference signal with the line current and generate an output indicative of the random disturbances, wherein the output of the comparator circuit is connected to the microcontroller.

4. The system of claim 3, wherein the reference circuit comprises:
    a phase locked loop configured to control a phase of the reference signal;
    a second filter circuit configured to block harmonics of the reference signal; and
    a gain control circuit configured to control an amplitude of the reference signal.

5. The system of claim 3, wherein the voltage channel circuit includes a first differential amplifier, and the current channel circuit includes a second differential amplifier, and wherein the first differential amplifier is configured to isolate the line voltage from the voltage channel circuit, and wherein the second differential amplifier is configured to isolate the line current from the current channel circuit.

6. The system of claim 1, wherein the load circuit comprises:
    four resistors and four respective thyristors, wherein the thyristors are enabled to draw current through the four resistors;
    a relay; and
    four power resistors configured to draw current based upon a state of the relay.

7. The system of claim 6, wherein the voltage channel circuit further comprises a zero-cross detection circuit configured to provide an output indicative of a zero-crossing of the line voltage.

8. The system of claim 7, wherein the microcontroller is further configured to operate the four thyristors and the relay to control current drawn by the load circuit and control the four thyristors and the switch based on the output of the zero-cross detection circuit.

9. The system of claim 1, further comprising a transformer connected between the line voltage and the first test circuit to attenuate the line voltage.

10. The system of claim 1, further comprising a display controlled by the microcontroller and configured to provide visual indication of the deteriorated junction.

11. A method of testing for deteriorated junctions within an electrical circuit, the method comprising:
    connecting, by a microcontroller, a first set of resistors across a line voltage of the electrical circuit to draw a first current;
    outputting, by a peak detector circuit, a peak voltage of a channel voltage based on the draw of the first current;
    connecting, by the microcontroller, a second set of resistors across the line voltage to draw a second current greater than the first current;
    outputting, by a first filter circuit, a direct current (DC) output voltage based on the line voltage and the draw of the second current; and
    detecting, by the microcontroller, a deteriorated junction of the electrical circuit based on the peak voltage and the DC output voltage.

12. The method of claim 11, wherein connecting, by the microcontroller, the first set of resistors comprises:
    enabling, by a microcontroller, a first thyristor to connect a first resistor across a line voltage of the electrical circuit to draw a first cold junction current;
    enabling, by the microcontroller, a second thyristor to connect a second resistor across the line voltage to draw a second cold junction current;

enabling, by the microcontroller, a third thyristor to connect a third resistor across the line voltage to draw a third cold junction current; and enabling, by the microcontroller, a fourth thyristor to connect a fourth resistor across the line voltage to draw a fourth cold junction current.

13. The method of claim 11, wherein outputting, by the peak detector circuit, the peak voltage comprises:

isolating, by a differential amplifier, an isolated channel voltage from the line voltage;

squaring, by a multiplier circuit, the isolated channel voltage to output a squared channel voltage; and outputting, by a peak detector circuit, a peak value of the squared channel voltage.

14. The method of claim 11, wherein outputting, by the first filter circuit, the direct current (DC) output voltage comprises:

filtering, by a low-pass filter, the squared channel voltage to provide a low-pass output; and outputting the DC output voltage based on the low-pass output.

15. The method of claim 11, wherein connecting, by the microcontroller, the second set of resistors across the line voltage comprises:

enabling, by the microcontroller, a relay to connect at least one power resistor across the line voltage to draw the second current.

16. The method of claim 11, further comprising:

detecting, by a current channel, random disturbances in the second current.

17. The method of claim 16, wherein detecting, by the current channel, the random disturbances comprises:

generating, using the current channel, a reference current; and comparing, using the current channel, the reference current to generate a compared current signal; and detecting, by the microcontroller, the random disturbances based on the compared current signal.

18. The method of claim 17, wherein generating, using the current channel, the reference current comprises:

controlling, using a phase locked loop, a reference phase of the reference current;

filtering, using a second filter circuit, harmonics of the reference current; and controlling, using a gain control circuit, an amplitude of the reference current.

19. The method of claim 18, wherein detecting, by the microcontroller, a deteriorated junction of the electrical circuit is based further upon the detected random disturbances.

20. The method of claim 19, further comprising:

outputting, from the microcontroller, information about the electrical circuit to a display, wherein the information includes the detected deteriorated junction; and displaying, using the display, the information about the electrical circuit.

* * * * *